United States Patent
Imada

(10) Patent No.: US 9,547,320 B2
(45) Date of Patent: Jan. 17, 2017

(54) POWER SUPPLY CIRCUIT AND POWER SUPPLY APPARATUS

(71) Applicant: FUJITSU LIMITED, Kawasaki-shi, Kanagawa (JP)

(72) Inventor: Tadahiro Imada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 599 days.

(21) Appl. No.: 13/962,309

(22) Filed: Aug. 8, 2013

(65) Prior Publication Data

US 2014/0078781 A1    Mar. 20, 2014

(30) Foreign Application Priority Data

Sep. 20, 2012  (JP) .................................. 2012-207252

(51) Int. Cl.

| G05F 1/46 | (2006.01) |
|---|---|
| H02M 3/24 | (2006.01) |
| H01L 29/778 | (2006.01) |
| H01L 29/40 | (2006.01) |
| H01L 29/423 | (2006.01) |
| H01L 29/20 | (2006.01) |

(52) U.S. Cl.
CPC .............. G05F 1/46 (2013.01); H01L 29/7787 (2013.01); H02M 3/24 (2013.01); *H01L 29/2003* (2013.01); *H01L 29/402* (2013.01); *H01L 29/42316* (2013.01)

(58) Field of Classification Search
CPC ............... H01L 29/7787; H01L 29/402; H01L 29/42316; H01L 29/2003; G05F 1/46; H02M 3/24
See application file for complete search history.

(56) References Cited

U.S. PATENT DOCUMENTS

| 4,797,584 | A | 1/1989 | Aguti et al. | |
|---|---|---|---|---|
| 5,081,371 | A * | 1/1992 | Wong | G05F 3/205 323/314 |
| 7,994,764 | B2 | 8/2011 | Koleno | |
| 8,502,323 | B2 * | 8/2013 | Chen | H01L 29/7786 257/392 |
| 2005/0007200 | A1 * | 1/2005 | Inoue | H03F 3/189 330/311 |

(Continued)

FOREIGN PATENT DOCUMENTS

| CN | 101359686 A | 2/2009 |
|---|---|---|
| CN | 102045927 A | 5/2011 |
| JP | 2006-324839 A1 | 11/2006 |

OTHER PUBLICATIONS

Office Action of corresponding Chinese Application No. 201310367058.5 dated Sep. 6, 2015 with full translation.

(Continued)

*Primary Examiner* — Jessica Han
(74) *Attorney, Agent, or Firm* — Kratz, Quintos & Hanson, LLP

(57) ABSTRACT

A power supply circuit includes: a depression mode transistor that includes a field plate; an enhancement mode transistor to which a source electrode and a drain electrode of the depression mode transistor are coupled; and a constant current source that is coupled to a connection node between the depression mode transistor and the enhancement mode transistor.

5 Claims, 6 Drawing Sheets

(56) References Cited

U.S. PATENT DOCUMENTS

2005/0040804 A1\* 2/2005 Hashimoto ............ G11C 5/147
                                                323/313
2009/0032820 A1   2/2009 Chen
2013/0088280 A1\* 4/2013 Lal ..................... H01L 25/00
                                                327/513

OTHER PUBLICATIONS

Office Action of corresponding Taiwanese Patent Application No. 102128490 dated Dec. 8, 2015, with English summary of TWOA based on cited reference.

\* cited by examiner

US 9,547,320 B2

POWER SUPPLY CIRCUIT AND POWER SUPPLY APPARATUS

CROSS-REFERENCE TO RELATED APPLICATION

This application is based upon and claims the benefit of priority from the prior Japanese Patent Application No. 2012-207252 filed on Sep. 20, 2012, the entire contents of which are incorporated herein by reference.

FIELD

The embodiments discussed herein are related to a power supply circuit and a power supply apparatus.

BACKGROUND

In recent years, an electronic device (compound semiconductor device) in which a GaN layer and an AlGaN layer are sequentially formed on a substrate formed of gallium nitride (GaN) or Si and the GaN layer is used as an electron transit layer is actively developed.

The band gap of the GaN is 3.4 eV, which is greater than 1.1 eV of Si and 1.4 eV of GaAs. Therefore, the compound semiconductor device is expected to perform an operation with high breakdown voltage.

One of such compound semiconductor devices is a GaN-based high electron mobility transistor (HEMT). Hereinafter, the GaN-based high electron mobility transistor is referred to as GaN-HEMT. The HEMT is a field effect transistor in which a high-mobility two-dimensional electron gas (2DEG) induced by semiconductor heterojunction is used as a channel.

When the GaN-HEMT is used as a switch of a power supply inverter, it is possible to reduce ON resistance as well as improve voltage resistance. Further, it is also possible to reduce standby power consumption and improve operating frequency as compared with a Si-based transistor.

Therefore, it is possible to reduce switching loss, so that the power consumption of the inverter may be reduced. The GaN-HEMT may be smaller than the Si-based transistor having the same performance as that of the GaN-HEMT.

When the GaN-HEMT is operated at high frequency and high voltage, a current collapse phenomenon occurs in which the drain current decreases. One of the causes of the current collapse phenomenon is assumed that free electrons are trapped at the electron trap level of a region near a side of the gate electrode, which faces the drain electrode. When the electrons are trapped at the trap level of the surface, the density of the 2DEG decreases and the output of the GaN-HEMT may decrease. As a countermeasure against the current collapse phenomenon, there is a GaN-HEMT with a source field plate, in which a field plate is provided to the source electrode.

However, there is a problem that the threshold value varies when the GaN-HEMT is OFF, a high voltage is applied to an insulating film below the source field plate, the insulating film is deteriorated, and the life of the GaN-HEMT is shortened.

The following is reference document:
[Document 1] Japanese Laid-open Patent Publication No. 2006-324839.

SUMMARY

According to an aspect of the invention, a power supply circuit includes: a depression mode transistor that includes a field plate; an enhancement mode transistor to which a source electrode and a drain electrode of the depression mode transistor are coupled; and a constant current source that is coupled to a connection node between the depression mode transistor and the enhancement mode transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

While a conventional silicon MOS-FET is a normally-off-type (enhancement mode) transistor which is turned off when no voltage is applied to the gate, the GaN-HEMT is a normally-on-type (depression mode) transistor which is normally turned on when no voltage is applied to the gate.

Therefore, to switch the depression mode GaN-HEMT, there is a method called a cascode connection in which the depression mode GaN-HEMT is combined with an enhancement mode FET to function as enhancement mode.

Figure 1:
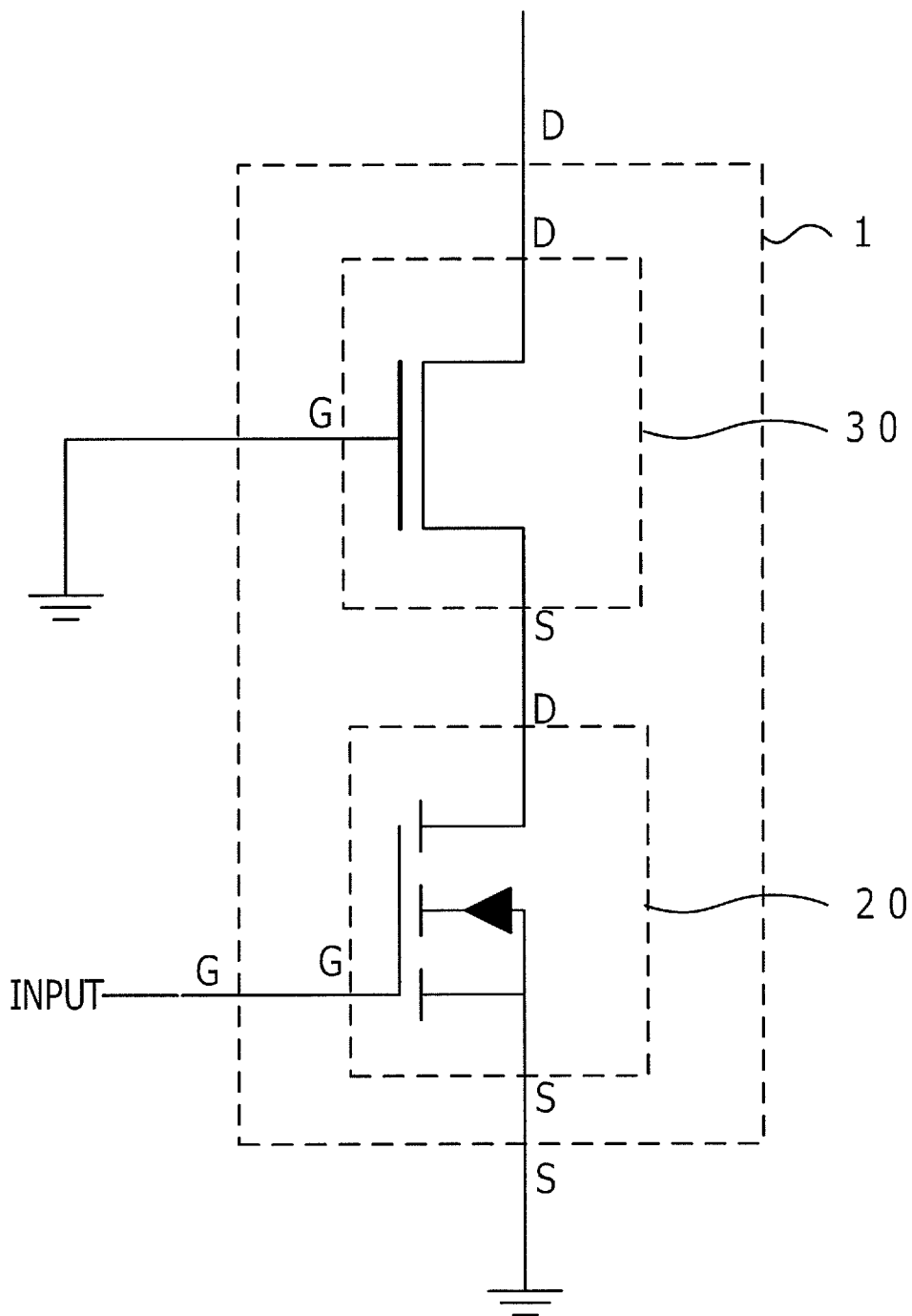
FIG. 1 is a circuit diagram of a cascode connection circuit.

FIG. 1 illustrates an example of a cascode connection circuit. The cascode connection circuit 1 is a circuit in which a depression mode GaN-HEMT 30 and an enhancement mode MOS-FET 20 are connected in series. The source of the GaN-HEMT 30 is connected to the drain of the MOS-FET 20. The gate of the GaN-HEMT 30 and the source of the MOS-FET 20 are grounded. The enhancement mode MOS-FET 20 is, for example, a commonly available silicon-based n-type MOS-FET.

Next, an operation of the cascode connection circuit 1 will be described. First, when the MOS-FET 20 is turned off, the resistance of the MOS-FET 20 increases and the drain voltage of the MOS-FET 20 rises in balance with the resistance value of the GaN-HEMT 30 which is still turned on. Then, the source voltage of the GaN-HEMT 30 becomes higher than the gate voltage of the GaN-HEMT 30 because the gate voltage of the GaN-HEMT 30 is 0 V. Here, for example, if the threshold value at which the GaN-HEMT 30 is turn off and on is −5 V, the GaN-HEMT 30 is turn off when the source voltage of the GaN-HEMT 30 becomes 5 V.

When the cascode connection circuit 1 is seen as one transistor, the drain of the GaN-HEMT 30 functions as the drain of the cascode connection circuit 1 and the source of the MOS-FET 20 functions as the source of the cascode connection circuit 1. Similarly, the gate of the MOS-FET 20 functions as the gate of the cascode connection circuit 1.

When the GaN-HEMT is operated at high frequency and high voltage, a current collapse phenomenon occurs in which the drain current decreases. One of the causes of the current collapse phenomenon is assumed that free electrons are trapped at the electron trap level of a region near a side of the gate electrode, which faces the drain electrode. When the electrons are trapped at the trap level of the surface, the density of the 2DEG decreases and the output of the GaN-HEMT may decrease.

Therefore, as a countermeasure against the current collapse phenomenon, there is a GaN-HEMT including a field plate.

Figure 2:
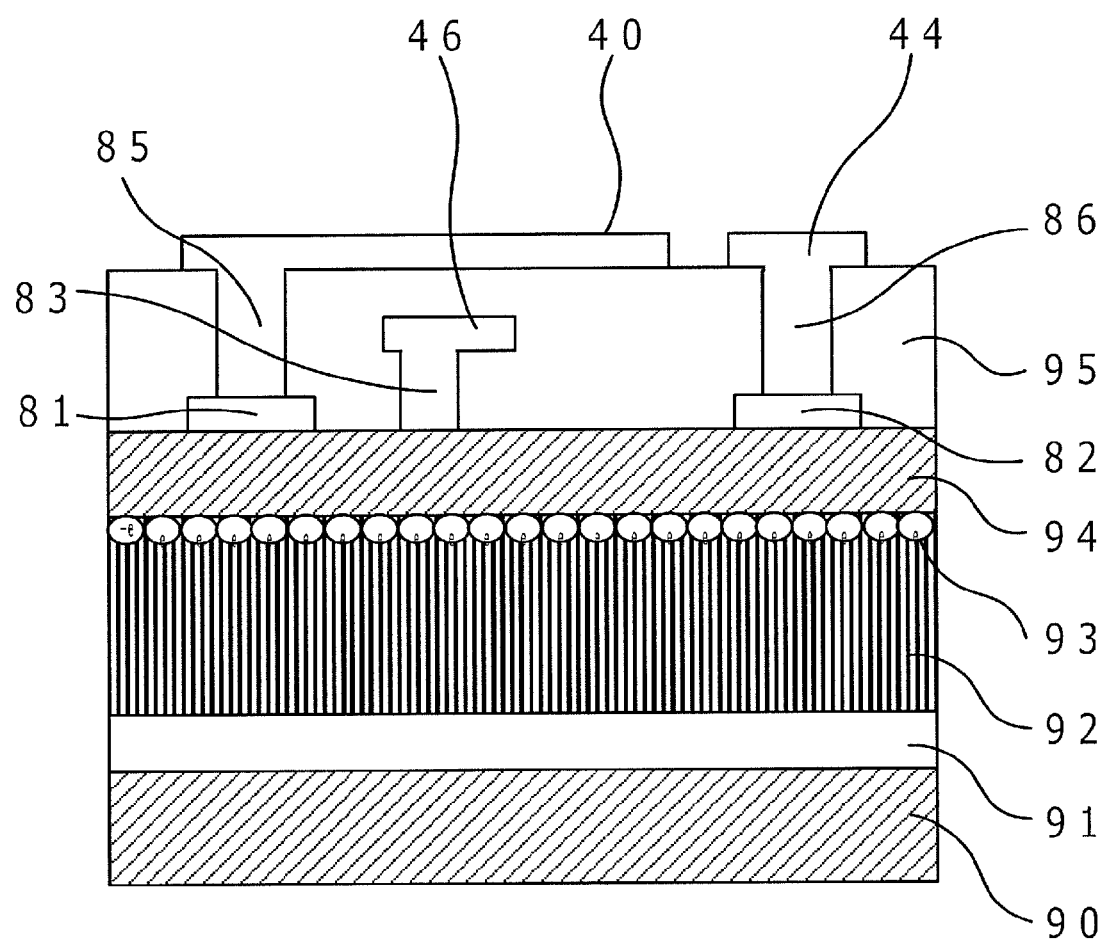
FIG. 2 is a structure diagram of a GaN-HEMT including a source field plate.

FIG. 2 is a cross-sectional view illustrating a structure of a GaN-HEMT 32 including a field plate. An AlN layer 91, a non-doped i-GaN layer 92, an n-type n-AlGaN layer 94 are sequentially formed on a SiC substrate 90. Further, a source electrode 81, a drain electrode 82, and a gate electrode 83 are formed on the n-AlGaN layer 94. In the GaN-HEMT 32, a two-dimensional electron gas (2DEG) 93 formed at the interface between the n-AlGaN layer 94 and the i-GaN layer 92 is used as a carrier. The AlN layer 91 functions as a buffer layer.

Further, an interlayer insulating film 95 formed of an insulating material such as polyimide is formed on the n-type n-AlGaN layer 94, the source electrode 81, the drain electrode 82, and the gate electrode 83.

In the interlayer insulating film 95, a gate field plate 42 is formed which is electrically connected to the gate electrode 83 and extends in the horizontal direction.

Further, in the interlayer insulating film 95, a source field plate 40 is formed which extends in the horizontal direction from over the source electrode 81 to a position beyond the gate field plate 42. The source field plate 40 is electrically connected to the source electrode 81 by a contact plug 85 formed in the interlayer insulating film 95.

Further, a drain electrode pad 44 is formed at the position of the drain electrode 82 on the interlayer insulating film 95 and electrically connected to the drain electrode 82 by a contact plug 86 formed in the interlayer insulating film 95.

When the source field plate 40 is seen as a second gate whose threshold value is more minus than that of the gate electrode 83, the GaN-HEMT 32 with a field plate may be seen as two devices.

Figure 3:
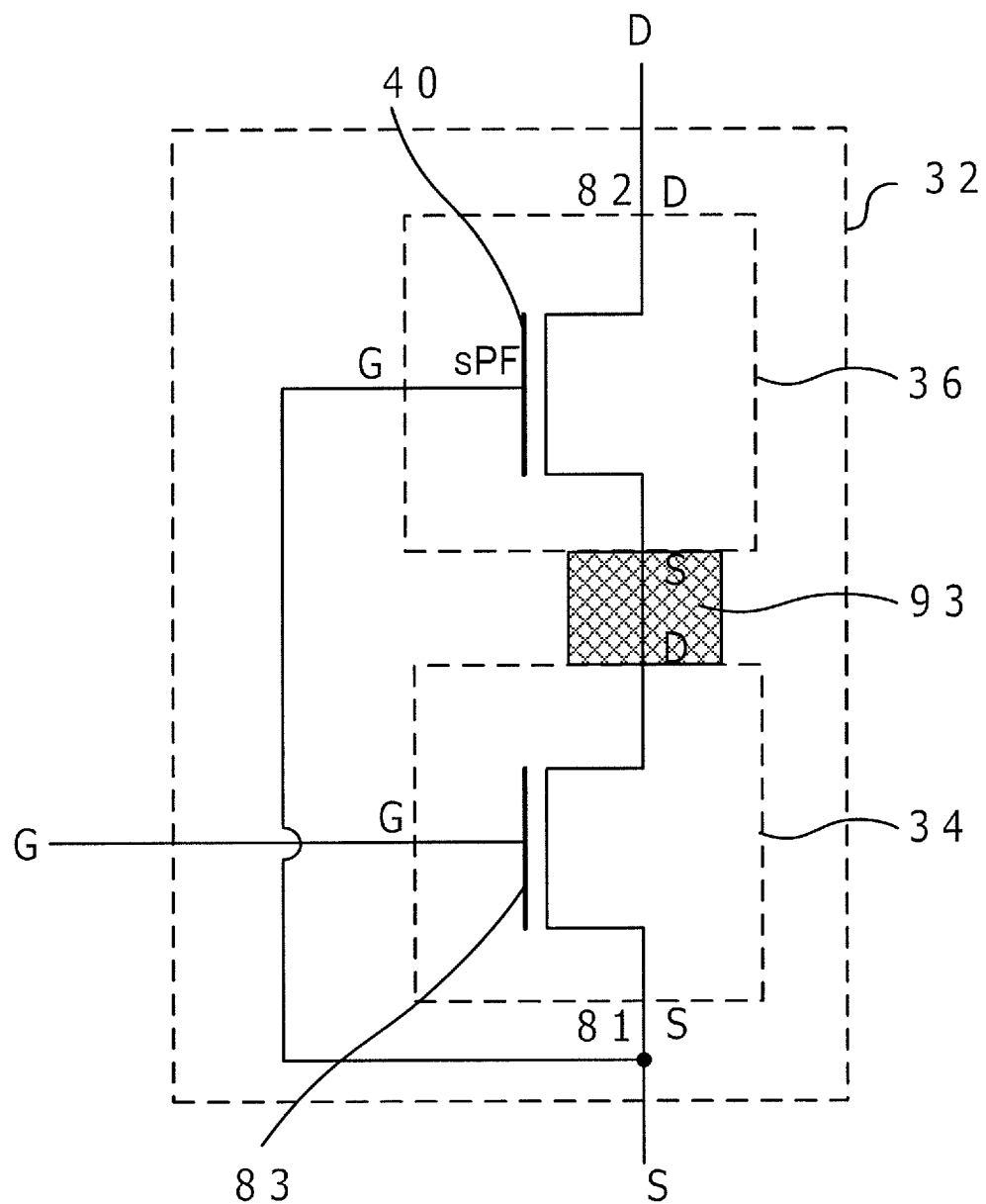
FIG. 3 is an equivalent circuit diagram of the GaN-HEMT including a source field plate.

FIG. 3 is an equivalent circuit diagram of the GaN-HEMT 32 with a field plate. A first device 34 uses the source electrode 81 of the GaN-HEMT 32 as the source, uses the gate electrode 83 of the GaN-HEMT 32 as the gate, and uses one end of the two-dimensional electron gas 93 below an end of the drain of the GaN-HEMT 32 as the drain.

A second device 36 uses the other end of the two-dimensional electron gas 93 below an end of the drain of the GaN-HEMT 32 as the source, uses the source field plate 40 of the GaN-HEMT 32 as the gate, and uses the drain electrode 82 of the GaN-HEMT 32 as the drain.

Next, an operation when the GaN-HEMT 32 with a field plate is turned off will be described. The threshold value of the gate of the first device 34 is assumed to be, for example, −5 V and the threshold value of the gate of the second device 36 is assumed to be, for example, −10 V.

When the gate voltage of the first device 34 is set to −5 V or lower and the first device 34 is turned off, the resistance below the gate of the first device 34 increases, so that the drain voltage of the first device 34 rises in balance with the resistance value of the second device 36 which is still turned on. As the voltage of the drain of the first device 34 rises, the voltage of the source of the second device 36 also rises, and when the source voltage of the second device 36 becomes 10 V, the second device 36 is turned off.

One of the causes of the current collapse phenomenon, which occurs when the GaN-HEMT is operated at high frequency and high voltage, is assumed that free electrons are trapped at the electron trap level of a region near a side of the gate electrode, which faces the drain electrode. The source field plate 40 has a function not to suppress the motion of the free electrons by stopping too strong electric field from being applied to a side of the gate electrode 83 which faces the drain electrode 82.

The inventors have performed a reliability test by replacing the GaN-HEMT 30 by the GaN-HEMT 32 with a field plate in the cascode connection circuit 1 used as the example described above.

Figure 4:
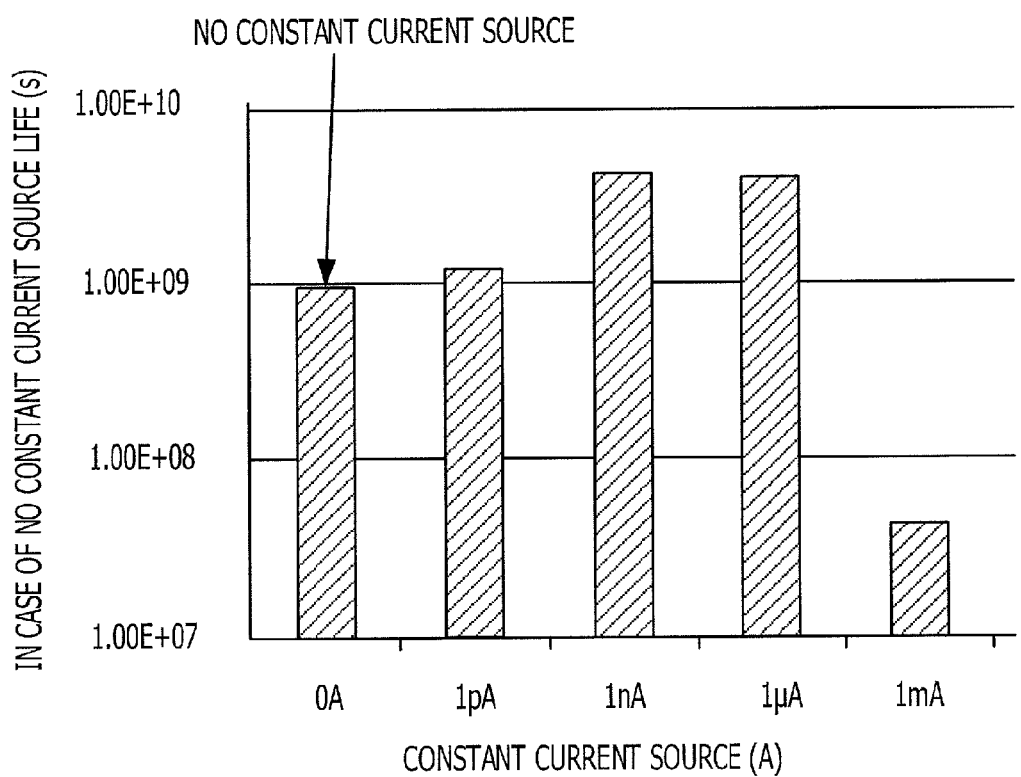
FIG. 4 is a diagram illustrating a result of a reliability test of the GaN-HEMT.

FIG. 4 illustrates a result of the reliability test of the GaN-HEMT 32. In FIG. 4, the leftmost vertical rectangle indicates the life of the GaN-HEMT 32 when 600 V is applied to the power supply of the cascode connection circuit 1 illustrated in FIG. 1, a pulse signal is inputted into the input terminal, and the cascode connection circuit 1 is repeatedly turned on and off. A result was obtained in which the GaN-HEMT 32 is broken in about $1.00 \times 10^{10}$ seconds.

The inventors have estimated the cause of the breaking of the GaN-HEMT 32 as described below. When the GaN-HEMT 32 is turned off, a leakage current flows from the source electrode 81 to the drain electrode 82 through crystals of GaN. When the leakage current is small, only a trap of a hole (positive hole) occurs immediately below the source field plate 40, and recombination and detrap do not occur. Thereby, a region below the source field plate 40 is positively charged, the density of the 2DEG increases, and the threshold value of the source field plate 40 changes from −10 V to, for example, −50 V. Then, if the source voltage of the second device 36 does not rise up to 50 V, the second device 36 will not be turned off. In this case, a high voltage of 50 V is applied to the interlayer insulating film 95 below the field plate 40, so that the deterioration of the interlayer insulating film 95 progresses, and finally the interlayer insulating film 95 is broken down. As a result, the life of the GaN-HEMT 32 is shortened.

Therefore, the inventors assumed that the reason why the life of the GaN-HEMT 32 is shortened is due to variation of the threshold value of the source field plate, and invented the embodiment described below.

Hereinafter, the preferred embodiment of the disclose technique will be described in detail with reference to the drawings.

Figure 5:
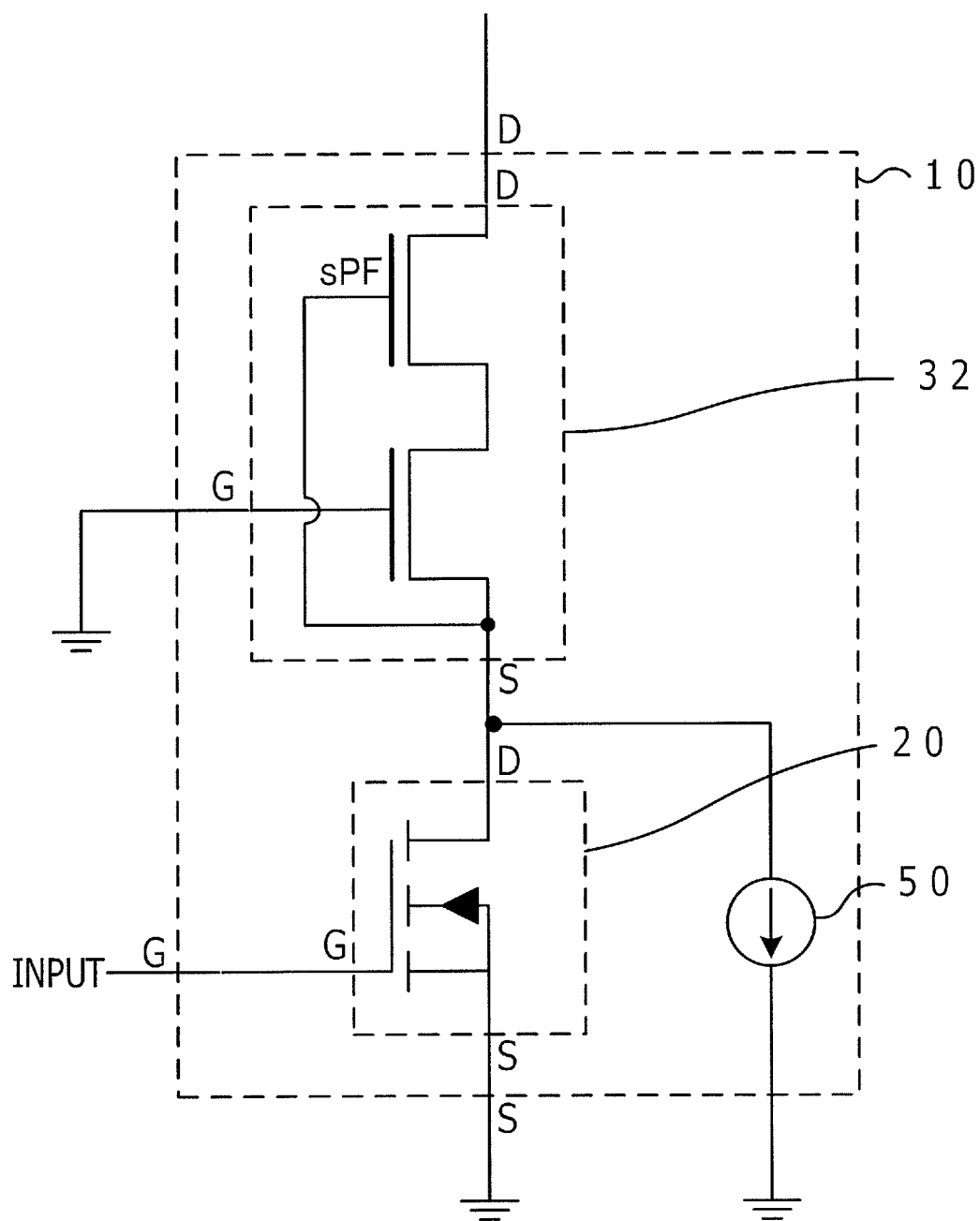
FIG. 5 is a circuit diagram of a power supply circuit of an embodiment.

FIG. 5 is a diagram illustrating a power supply circuit 10 according to the embodiment to which the disclosed technique is applied. In FIG. 5, the same components as those in the cascode connection circuit 1 illustrated in FIG. 1 are denoted by the same reference numerals and the description thereof will be omitted.

The power supply circuit 10 of the present embodiment is a cascode connection circuit in which the GaN-HEMT 32 with a field plate and the enhancement mode MOS-FET 20 are connected in series. The source of the GaN-HEMT 32 is connected to the drain of the MOS-FET 20. The gate of the GaN-HEMT 32 and the source of the MOS-FET 20 are grounded. The enhancement mode MOS-FET 20 is, for example, a commonly available silicon-based n-type MOS-FET. Further, a constant current source 50 is connected to a node at which the source of the GaN-HEMT 32 and the drain of the MOS-FET 20 are connected. The constant current source 50 is formed by a general constant current circuit and, for example, a current mirror circuit is used.

The constant current source 50 has a function to flow a certain amount of the leakage current flowing from the source electrode 81 of the GaN-HEMT 32 to the drain electrode 82 through crystals of GaN when the GaN-HEMT 32 is turned off.

In FIG. 4, from the second left to the fifth left vertical rectangles indicate the life of the GaN-HEMT 32 when 600 V is applied to the power supply circuit 10 illustrated in FIG. 5, a pulse signal is inputted into the input terminal, and the power supply circuit 10 is repeatedly turned on and off. The vertical rectangles indicate a result of comparison of the life of the GaN-HEMT 32, which is obtained by changing the current flowed by the constant current source 50 to 1 pA, 1 nA, 1 µA, and 1 mA for the GaN-HEMT 32 whose rated current is 100 mA.

The difference of the life is not observed between a case in which the current flowed by the constant current source 50 is 1 µA and a case in which there is no constant current source. It is known that there is not so much effect when the leakage current is increased by only 1 µA.

When the current flowed by the constant current source 50 is 1 nA and 1 µA, it is observed that the life is lengthened by about six times as compared with a case in which there is not the constant current source 50. If the leakage current when the GaN-HEMT 32 is turned off is increased by connecting the constant current source 50 to the GaN-HEMT 32, even when holes are trapped below the source field plate 40 when GaN-HEMT 32 is turned off, the holes are easily detrapped or easily recombined with electrons. Therefore, the density of the 2DEG below the source field plate 40 does not change, so that the threshold value when the source field plate 40 is seen as a second gate does not change.

Since the threshold value of the source field plate 40 does not change, a high voltage is not applied to the interlayer insulating film 95 below the field plate 40. Therefore, it is assumed that the deterioration of the interlayer insulating film 95 does not progress and the life of the GaN-HEMT 32 is lengthened.

When the current flowed by the constant current source 50 is 1 mA, a large current flows between the source and the drain of the GaN-HEMT 32 in a state in which a high voltage is applied between the source and the drain of the GaN-HEMT 32, so that a large load is applied locally to a part of the GaN-HEMT 32. Therefore, it is assumed that the voltage and current exceed a range of SOA (Safe Operation Area), which is an area of voltage and current in which the GaN-HEMT 32 operates stably, for a long time, so that the life of the GaN-HEMT 32 is significantly shortened.

Thereby, it has become clear that there is an effect when the current flowed by the constant current source 50 is 1 nA and 1 µA. It is assumed that the threshold value of the source field plate 40 does not change when increasing the leakage current in a range determined by the rated current of the GaN-HEMT 32, so that the deterioration of the GaN-HEMT 32 does not progress.

In the present embodiment, the leakage current when the GaN-HEMT 32 is turned off is increased by increasing the leakage current by the constant current source 50 in a range determined by the rated current of the GaN-HEMT 32, so that a high voltage is not applied to the interlayer insulating film 95 below the field plate 40. Therefore, it is possible to stop the interlayer insulating film 95 from deteriorating and lengthen the life of the GaN-HEMT 32.

In the present embodiment, the GaN-HEMT 32 with the source field plate 40 is described in which the source electrode 81 has a field plate. However, the same effect may be obtained from a GaN-HEMT with a gate field plate, in which the gate electrode 83 has a field plate.

Even when a mere resistance, instead of the constant current source 50, is connected to the node at which the source of the GaN-HEMT 32 and the drain of the MOS-FET 20 are connected, the leakage current when the GaN-HEMT 32 is turned off may be increased to some extent, so that the effect may be expected to some extent.

Figure 6:
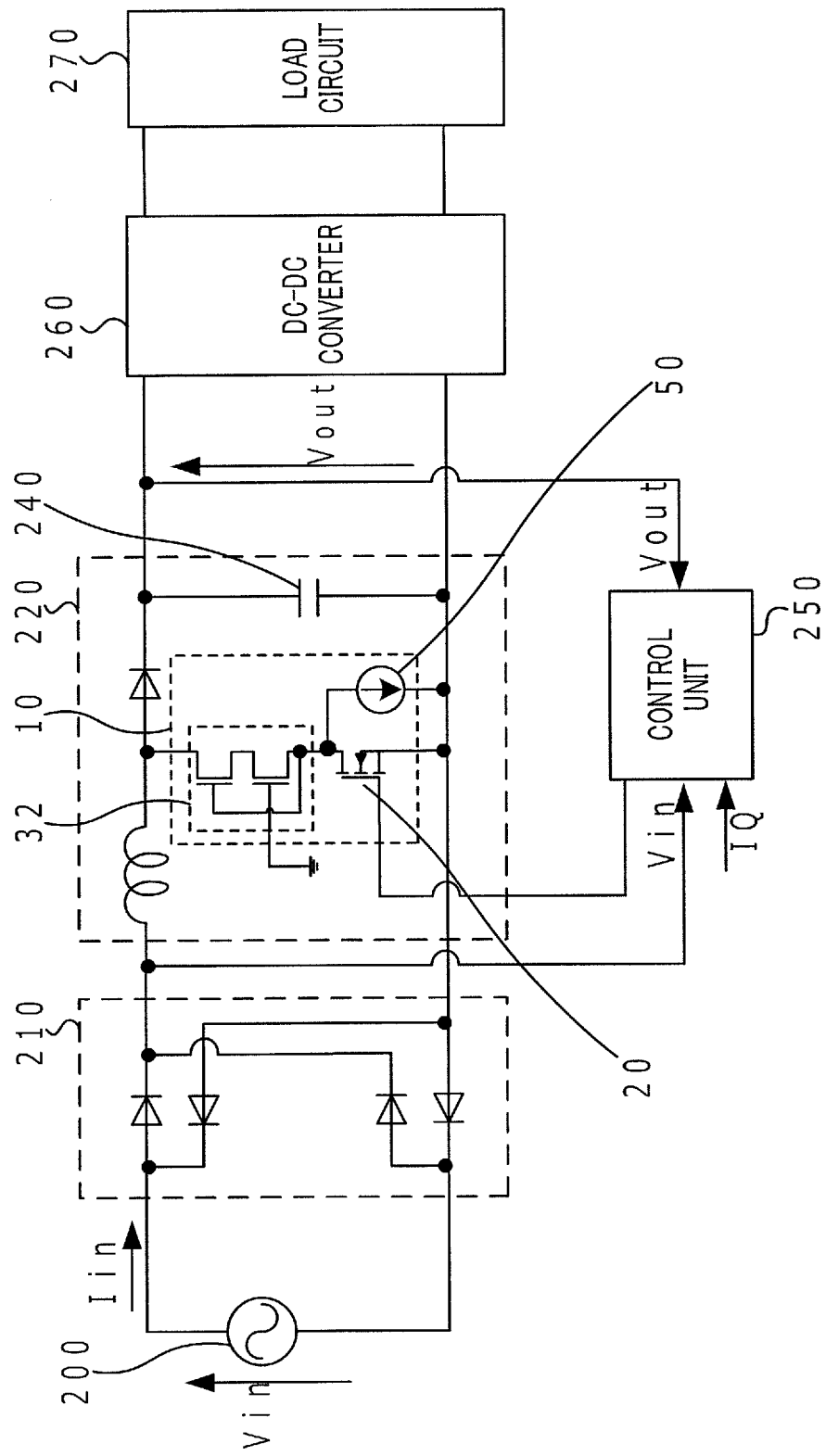
FIG. 6 is a diagram of a power supply apparatus to which the power supply circuit of the embodiment is applied.

FIG. 6 is a circuit diagram of a power supply apparatus that uses the power supply circuit 10 of the present embodiment. The power supply circuit 10 of the embodiment is provided in power factor correction (PFC) to improve the power factor of a power supply in the power supply apparatus. The power supply apparatus illustrated in FIG. 6 includes a rectifier circuit 210, a PFC circuit 220, a control unit 250, and a direct current (DC)-DC converter 260.

The rectifier circuit 210 is connected to an AC power supply 200. The rectifier circuit 210 full-wave rectifies AC power and outputs the AC power. Here, the output voltage of the AC power supply 200 is Vin, so that the input voltage of the rectifier circuit 210 is Vin. The rectifier circuit 210 outputs power which is obtained by full-wave rectifying AC power inputted from the AC power supply 200. For example, AC power of a voltage of 80 V to 265 V is inputted into the rectifier circuit 210, so that the output voltage of the rectifier circuit 210 is also Vin.

The PFC circuit 220 includes an inductor, the power supply circuit 10 of the embodiment that functions as a switching device, and a diode, which are connected in a T shape, and a smoothing capacitor 240. The PFC circuit 220 is an active filter circuit which reduces distortion of harmonic and the like included in the current rectified by the rectifier circuit 210 and improves the power factor.

The control unit 250 outputs a pulse-shaped gate voltage applied to the gate of the power supply circuit 10. The control unit 250 determines a duty ratio of the gate voltage on the basis of a voltage value Vin of the full-wave rectified power outputted from the rectifier circuit 210, a current value of the current flowing through the power supply circuit 10, and a voltage value Vout of the output side of the smoothing capacitor 240, and applies the gate voltage to the gate of a switching device 10A. As the control unit 250, for example, a multiplier circuit that may calculate the duty ratio on the basis of the current value of the current flowing through the power supply circuit 10 and the voltage values Vout and Vin may be used.

The smoothing capacitor 240 smoothes the voltage outputted from the PFC circuit 220 and inputs the voltage into the DC-DC converter 260. As the DC-DC converter 260, for example, a forward DC-DC converter or a full bridge DC-DC converter may be used. For example, AC power of a voltage of 385 V is inputted into the DC-DC converter 260.

The DC-DC converter 260 is a conversion circuit that converts and outputs the voltage value of the AC power. A load circuit 270 is connected to the output side of the DC-DC converter 260.

Here, for example, the DC-DC converter 260 converts the AC power of a voltage of 385 V into DC power of a voltage of 12 V and outputs the DC power to the load circuit 270.

According to the present embodiment, even when the GaN-HEMT 32 in the power supply circuit 10 in the PFC circuit 220 is used at high frequency and high voltage, the current collapse phenomenon hardly occurs, so that an efficient power supply apparatus may be provided. Further, the deterioration of the GaN-HEMT 32 is small, so that a high quality supply apparatus may be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A power supply circuit, comprising:
a depression mode transistor that includes a field plate;
an enhancement mode transistor to which a drain electrode and a source electrode of the depression mode transistor are coupled; and
a constant current source that is coupled to a connection node between the depression mode transistor and the enhancement mode transistor.

2. The power supply circuit according to claim 1,
wherein the depression mode transistor is formed of a compound semiconductor device including nitrogen.

3. The power supply circuit according to claim 1,
wherein the field plate is a source field plate coupled to the source electrode of the depression mode transistor.

4. The power supply circuit according to claim 1,
wherein the constant current source flows a current of $1\times10^{-11}$ to $1\times10^{-2}$ of a rated current of the depression mode transistor.

5. A power supply apparatus, comprising:
a DC-DC converter; and
a power supply circuit configured to supply power to the DC-DC converter,
wherein the power supply circuit includes
a depression mode transistor that includes a field plate,
an enhancement mode transistor to which a drain electrode and a source electrode of the depression mode transistor are coupled, and
a constant current source that is coupled to a connection node between the depression mode transistor and the enhancement mode transistor.

* * * * *